United States Patent
Aoki et al.

(10) Patent No.: US 11,053,457 B2
(45) Date of Patent: Jul. 6, 2021

(54) CLEANING COMPOSITION FOR SEMICONDUCTOR SUBSTRATE

(71) Applicant: JSR CORPORATION, Tokyo (JP)

(72) Inventors: Shun Aoki, Tokyo (JP); Kan-go Chung, Tokyo (JP); Tomohiro Matsuki, Tokyo (JP); Tatsuya Sakai, Tokyo (JP); Kenji Mochida, Tokyo (JP); Yuushi Matsumura, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 16/595,899

(22) Filed: Oct. 8, 2019

(65) Prior Publication Data

US 2020/0040282 A1    Feb. 6, 2020

Related U.S. Application Data

(63) Continuation of application No. PCT/JP2018/014804, filed on Apr. 6, 2018.

(30) Foreign Application Priority Data

Apr. 13, 2017 (JP) .............................. JP2017-079797

(51) Int. Cl.
  *C11D 3/37*   (2006.01)
  *C11D 3/20*   (2006.01)
  (Continued)

(52) U.S. Cl.
  CPC ............ *C11D 3/2082* (2013.01); *C11D 1/008* (2013.01); *C11D 3/2079* (2013.01); *H01L 21/02057* (2013.01)

(58) Field of Classification Search
  CPC ...... C11D 11/0047; C11D 3/37; B08B 7/0014
  (Continued)

(56) References Cited

U.S. PATENT DOCUMENTS

2008/0196744 A1* 8/2008 Nagayama .......... C23C 16/4405
                                                                134/4
2014/0041685 A1* 2/2014 Kaneko ..................... B08B 3/08
                                                                134/4
(Continued)

FOREIGN PATENT DOCUMENTS

JP          7-74137 A     3/1995
JP      2013-151677 A     8/2013
(Continued)

OTHER PUBLICATIONS

International Search Report dated May 22, 2018 in PCT/JP2018/014804 (with English translation), 5 pages.
(Continued)

*Primary Examiner* — Gregory E Webb
(74) *Attorney, Agent, or Firm* — Oblon, McClelland, Maier & Neustadt, L.L.P.

(57) ABSTRACT

A composition for cleaning a semiconductor substrate contains: a novolak resin; an organic acid not being a polymeric compound; and a solvent. A solid content concentration of the composition is no greater than 20% by mass. The organic acid is preferably a carboxylic acid. The carboxylic acid is preferably a monocarboxylic acid, polycarboxylic acid or a combination thereof. The molecular weight of the organic acid is preferably from 50 to 500. The content of the organic acid with respect to 10 parts by mass of the novolak resin is preferably from 0.001 parts by mass to 10 parts by mass. The solvent includes preferably an ether solvent, an alcohol solvent, or a combination thereof. The proportion of the ether solvent, the alcohol solvent, or the combination thereof in the solvent is preferably no less than 50% by mass.

20 Claims, 1 Drawing Sheet

(51) Int. Cl.
*C11D 1/00* (2006.01)
*H01L 21/02* (2006.01)

(58) Field of Classification Search
USPC .............................................. 134/4; 510/175
See application file for complete search history.

(56) References Cited

U.S. PATENT DOCUMENTS

| | | | |
|---|---|---|---|
| 2014/0083454 A1* | 3/2014 | Wakamatsu | B29C 33/722 134/4 |
| 2014/0144464 A1* | 5/2014 | Kaneko | H01L 21/0209 134/4 |
| 2014/0144465 A1* | 5/2014 | Kaneko | H01L 21/68728 134/4 |
| 2015/0064910 A1* | 3/2015 | Kaneko | B05B 7/00 438/694 |
| 2015/0185613 A1* | 7/2015 | Toyokawa | C08G 8/20 438/704 |
| 2016/0032227 A1* | 2/2016 | Mochida | C11D 11/0047 510/175 |
| 2016/0035564 A1* | 2/2016 | Aibara | H01L 21/02057 134/4 |
| 2018/0211828 A1* | 7/2018 | Chung | C11D 11/0047 |
| 2020/0140792 A1* | 5/2020 | Kishioka | C11D 11/0047 |

FOREIGN PATENT DOCUMENTS

| | | |
|---|---|---|
| JP | 2014-99583 A | 5/2014 |
| JP | 2016-33198 A | 3/2016 |
| JP | 2016-34006 A | 3/2016 |
| JP | 2016-36012 A | 3/2016 |
| WO | WO 2017/056746 A1 | 4/2017 |

OTHER PUBLICATIONS

Written Opinion of the International Searching Authority dated May 22, 2018 in PCT/JP2018/014804 (with Engiish translation), 10 pages.

* cited by examiner

CLEANING COMPOSITION FOR SEMICONDUCTOR SUBSTRATE

CROSS-REFERENCE TO RELATED APPLICATIONS

The present application is a continuation application of International Application No. PCT/JP2018/014804, filed Apr. 6, 2018, which claims priority to Japanese Patent Application No. 2017-079797, filed Apr. 13, 2017. The contents of these applications are incorporated herein by reference in their entirety.

BACKGROUND OF THE INVENTION

Field of the Invention

The present invention relates to a composition for cleaning a semiconductor substrate.

Discussion of the Background

In production processes of semiconductor substrates, cleaning is conducted in order to remove contaminants such as particles attached onto the surface of the substrates having a pattern formed thereon. In recent years, miniaturization of the formed pattern, and an increase of the aspect ratio have advanced. In cleaning through using a liquid and/or gas, it is difficult to achieve the flow of the liquid and/or gas between the pattern wall in the vicinity of a substrate surface, thereby making removal of fine particles and/or the attached particles between the pattern walls difficult.

Japanese Unexamined Patent Application, Publication No. 117-74137 discloses a method in which after feeding a coating liquid on a substrate surface to provide a thin film, particles on the substrate surface are removed by detachment of the thin film with an adhesive tape. According to this method, fine particles and the particles between pattern walls can be reportedly removed at a high removal rate while influences on the semiconductor substrate are decreased.

Japanese Unexamined Patent Application, Publication No. 2014-99583 discloses an apparatus for cleaning a substrate, and a cleaning method for a substrate, in which a treatment liquid for forming a film on a substrate surface is supplied and solidified or hardened, and then the entire treatment liquid solidified or hardened is dissolved in a removing liquid to remove particles on the substrate surface.

However, when there is necessity for physically peeling off the thin film from the surface of the substrate, the methods are problematic in complexity of steps, as well as difficulty in removal when a part of the thin film remains in the pattern. Furthermore, although the detailed description of the Patent Document discloses a top coating liquid as a non-limiting example of the treatment liquid in Patent Document described below, a detailed description as to which treatment liquid is suited is not found.

SUMMARY OF THE INVENTION

According to an aspect of the present invention, a composition for cleaning a semiconductor substrate contains: a novolak resin; an organic acid not being a polymeric compound; and a solvent. A solid content concentration of the composition is no greater than 20% by mass.

DESCRIPTION OF EMBODIMENTS

According to an embodiment of the invention, a composition for cleaning a semiconductor substrate contains: a novolak resin; an organic acid not being a polymeric compound; and a solvent,
wherein a solid content concentration of the composition is no greater than 20% by mass.

The term "not being a polymeric compound" as referred to herein means a compound not having a repeating structure generated through a polymerization or condensation reaction.

According to the embodiment of the present invention, a composition for cleaning a semiconductor substrate, for use in a process of removing unwanted substances on the surface of a semiconductor substrate through forming a film on the substrate surface can be provided, wherein the composition is capable of efficiently removing fine particles on the substrate surface and enables the formed film to be easily removed from the substrate surface. The composition for cleaning a semiconductor substrate of the embodiment of the present invention can be suitably used in manufacturing processes of semiconductor elements for which further progress of miniaturization, and an increase of the aspect ratio are expected in the future.

Composition for Cleaning Semiconductor Substrate

The composition for cleaning a semiconductor substrate (hereinafter, may be also merely referred to as "cleaning composition") according to an embodiment of the present invention is a composition for use in cleaning a semiconductor substrate, the composition containing a novolak resin (hereinafter, may be also referred to as "(A) novolak resin" or "novolak resin (A)"), an organic acid not being a polymeric compound (hereinafter, may be also referred to as "(B) organic acid" or "organic acid (B)"), and a solvent (hereinafter, may be also referred to as "(C) solvent" or "solvent (C)"), wherein a solid content concentration of the composition is no greater than 20% by mass. A film is formed on the surface of a semiconductor substrate by using the cleaning composition and then the film is removed, thereby enabling particles, etc. attached to the surface of the semiconductor substrate, particularly a patterned semiconductor substrate, to be efficiently removed.

Furthermore, the cleaning composition may contain in addition to components (A) to (C), other optional component(s) within a range not leading to impairment of the effects of the present invention. Hereinafter, each component will be explained.

(A) Novolak Resin

The novolak resin (A) is a chain polymer obtained by allowing a compound having an aromatic ring to react with an aldehyde compound by using an acidic catalyst. The novolak resin (A) may be used either alone of one type, or in combination of two or more types thereof.

The compound having an aromatic ring is exemplified by a substituted or unsubstituted aromatic hydrocarbon compound having 6 to 20 carbon atoms. Examples of the aromatic hydrocarbon compound having 6 to 20 carbon atoms include benzene, toluene, xylene, phenol, pyrogallol, cresol, naphthalene, α-naphthol, β-naphthol, 1,5-dihydroxynaphthalene, 2,7-dihydroxynaphthalene, anthracene, phenanthrene, tetracene, pyrene, 1-hydroxypyrene, triphenylene, fluorene, 9,9-bis(4-hydroxyphenyl)fluorene, 9,9-bis(6-hydroxynaphthyl)fluorene, indenofluorene, truxene, and the like.

Examples of the aldehyde compound include aldehydes such as formaldehyde, acetaldehyde, propionaldehyde, benzaldehyde and parahydroxybenzaldehyde, and the like. Of these, formaldehyde is preferred. It is to be noted that paraformaldehyde may be used in place of formaldehyde, and paraldehyde may be used in place of acetaldehyde.

The novolak resin (A) preferably has the structural unit (I) represented by the following formula (I) described later.

Structural Unit (I)

The structural unit (I) is represented by the following formula (I).

(I)

In the above formula (I), $Ar^1$ represents a group having a valency of (m+2) obtained by eliminating (m+2) hydrogen atoms on the aromatic ring from an arene having 6 to 20 carbon atoms; $R^1$ represents a substituted or unsubstituted alkylene group having 1 to 20 carbon atoms; X represents a monovalent hetero atom-containing group or a monovalent organic group; and m is an integer of 0 to 10, wherein in a case in which m is an integer of no less than 2, a plurality of Xs are identical or different.

Examples of the arene having 6 to 20 carbon atoms that is capable of giving $Ar^1$ include benzene, naphthalene, anthracene, phenanthrene, tetracene, pyrene, triphenylene, fluorene, truxene, and the like. Of these, benzene and naphthalene are preferred, and benzene is more preferred.

X represents preferably a hydroxy group, a halogen atom or a monovalent organic group having 1 to 20 carbon atoms, and more preferably a hydroxy group or an alkyl group. With respect to the structural unit (1), it is preferred that in the formula (I), in is an integer of no less than 1, and at least one of Xs represents a hydroxy group. The "organic group" as referred to herein means a group having at least one carbon atom.

The monovalent organic group which may be represented by X is exemplified by: a monovalent hydrocarbon group having 1 to 20 carbon atoms; a group (α) obtained from the monovalent hydrocarbon group by incorporating a divalent hetero atom-containing group between two adjacent carbon atoms thereof; a group (β) obtained by substituting with a monovalent hetero atom-containing group, a part or all of hydrogen atoms included in the hydrocarbon group or the group (a) including the divalent hetero atom-containing group; and the like.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms include groups obtained from: alkanes such as methane, ethane, propane and butane; alkenes such as ethene, propene and butene; alkynes such as ethyne, propyne and butyne; and the like by eliminating one hydrogen atom included therein, and the like.

Examples of the monovalent alicyclic hydrocarbon group having 3 to 20 carbon atoms include groups obtained from: alicyclic saturated hydrocarbons, e.g., cycloalkanes such as cyclopentane and cyclohexane, bridged cyclic saturated hydrocarbons such as norbornane, adamantane and tricyclodecane, and the like; alicyclic unsaturated hydrocarbons, e.g., cycloalkenes such as cyclopentene and cyclohexene, bridged cyclic unsaturated hydrocarbons such as norbornene and tricyclodecene, and the like; and the like by eliminating one hydrogen atom included therein.

Examples of the monovalent aromatic hydrocarbon group having 6 to 20 carbon atoms include groups obtained from: arenes such as benzene, toluene, ethylbenzene, xylene, naphthalene, methylnaphthalene, anthracene and methylanthracene by eliminating a hydrogen atom on the aromatic ring or a hydrogen atom on the alkyl group, and the like.

The hetero atom constituting the divalent or monovalent hetero atom-containing group is exemplified by an oxygen atom, a nitrogen atom, a sulfur atom, a phosphorus atom, a silicon atom, a halogen atom, and the like. Examples of the halogen atom include a fluorine atom, a chlorine atom, a bromine atom, an iodine atom, and the like.

Examples of the divalent hetero atom-containing group include —O—, —CO—, —S—, —CS—, —NR'—, groups obtained by combining at least two of the same, and the like, wherein R' represents a hydrogen atom or a monovalent hydrocarbon group. Of these, —O— and —S— are preferred. As the monovalent organic group which may be represented by X, an oxyhydrocarbon group is preferred. The oxyhydrocarbon group is preferably an alkyloxy group, and more preferably a methoxy group, an ethoxy group or a propoxy group.

Examples of the monovalent hetero atom-containing group include halogen atoms such as a fluorine atom, a chlorine atom, a bromine atom and an iodine atom, a hydroxy group, a carboxy group, a cyano group, an amino group, a sulfanyl group, and the like.

In the above formula (I), m is preferably an integer of 1 to 3, more preferably 1 or 2, and still more preferably 1.

Examples of the substituted or unsubstituted alkylene group having 1 to 20 carbon atoms represented by $R^1$ include a methylene group, a methylmethylene group, a phenylmethylene group, a parahydroxyphenylmethylene group, and the like. Of these, a methylene group and a methylmethylene group are preferred, and a methylene group is more preferred.

The lower limit of the weight average molecular weight (Mw) of the novolak resin (A) is preferably 500, more preferably 1,000, still more preferably 1,500, and particularly preferably 2,500. Meanwhile, the upper limit of the Mw is preferably 100,000, more preferably 60,000, and still more preferably 40,000.

The Mw as referred to herein is a value determined on gel permeation chromatography (detector: differential refractometer) by using GPC columns available from Tosoh Corporation ("G2000HXL"×2, "G3000HXL"×1 and "G4000HXL"×1) under analytical conditions involving flow rate: 1.0 mL/min, elution solvent: tetrahydrofuran, and column temperature: 40° C., with mono-dispersed polystyrene as a standard.

The lower limit of the proportion of the novolak resin (A) contained in the solid content of the cleaning composition is preferably 70% by mass, more preferably 80% by mass, still more preferably 90% by mass, and particularly preferably 95% by mass. The upper limit of the proportion of the novolak resin (A) contained is preferably 99.99% by mass, more preferably 99.9% by mass, and still more preferably 99.0% by mass.

The term "solid content" as referred to herein means any component other than the solvent (C) in the cleaning composition.

(B) Organic Acid

The organic acid (B) is an organic acid not being a polymeric compound. By including the organic acid (B), removal of the film formed on the surface of the substrate is facilitated. The upper limit of the molecular weight of the organic acid (B) is, for example, 500, preferably 400, and more preferably 300. The lower limit of the molecular weight of the organic acid (B) is, for example 50, and preferably 55. The organic acid (B) may be used either alone of one type, or in combination of two or more types thereof.

As the organic acid (B), carboxylic acids are preferred. Specific examples include:

carboxylic acids constituted of a carboxy group with an aliphatic saturated hydrocarbon group and/or an aromatic hydrocarbon group, such as acetic acid, propionic acid, butanoic acid, pentanoic acid, hexanoic acid, cyclohexanecarboxylic acid, cyclohexyl acetic acid, 1-adamantanecarboxylic acid, benzoic acid and phenylacetic acid;

fluorine atom-containing monocarboxylic acids such as difluoroacetic acid, trifluoroacetic acid, pentafluoropropanoic acid, heptafluorobutanoic acid, fluorophenylacetic acid and difluorobenzoic acid;

monocarboxylic acids including a hetero atom other than a fluorine atom at a part other than the carboxy group, such as 10-hydroxydecanoic acid, 5-oxohexanoic acid, 3-methoxycyclohexanecarboxylic acid, camphorcarboxylic acid, dinitrobenzoic acid, nitrophenylacetic acid, lactic acid, glycolic acid, glyceric acid, salicylic acid, anisic acid, gallic acid and furan carboxylic acid;

monocarboxylic acid compounds, e.g., double bond-containing monocarboxylic acids such as (meth)acrylic acid, crotonic acid, cinnamic acid and sorbic acid;

polycarboxylic acids constituted of a plurality of carboxy groups with a single bond, an aliphatic saturated hydrocarbon group and/or an aromatic hydrocarbon group, such as oxalic acid, malonic acid, succinic acid, glutaric acid, adipic acid, dodecanedicarboxylic acid, propanetricarboxylic acid, butanetetracarboxylic acid, cyclohexanehexacarboxylic acid, 1,4-naphthalenedicarboxylic acid, phthalic acid, isophthalic acid, terephthalic acid, trimellitic acid, pyromellitic acid and 1,2,3,4-cyclobutanetetracarboxylic acid;

partially esterified products of the polycarboxylic acids;

fluorine atom-containing polycarboxylic acids such as difluoromalonic acid, tetrafluorophthalic acid and hexafluoroglutaric acid;

polycarboxylic acids including a hetero atom other than a fluorine atom at a part other than the carboxy group, such as tartaric acid, citric acid, malic acid, tartronic acid, diglycolic acid and iminodiacetic acid;

polycarboxylic acid compounds, e.g., double bond-containing polycarboxylic acids such as maleic acid, fumaric acid and aconitic acid; and the like.

The lower limit of the solubility of the organic acid (B) in water at 25° C. is preferably 5% by mass, more preferably 7% by mass, and still more preferably 10% by mass. The upper limit of the solubility of the organic acid (B) is preferably 50% by mass, more preferably 40% by mass, and still more preferably 30% by mass. When the solubility of the organic acid (B) falls within the above range, removal of the film formed can be more facilitated.

It is preferred that the organic acid (B) is solid at 25° C. When the organic acid (B) is solid at 25° C., the solid organic acid (B) would be segregated in the film formed from the cleaning composition, leading to an improvement of removability.

In light of more facilitated removal of the film, the organic acid (B) is preferably the polycarboxylic acid, and more preferably malonic acid, succinic acid, glutaric acid, adipic acid, dodecanedicarboxylic acid, propanetricarboxylic acid, butanetetracarboxylic acid, hexafluoroglutaric acid, cyclohexanehexacarboxylic acid, 1,4-naphthalenedicarboxylic acid, phthalic acid, isophthalic acid, terephthalic acid, trimellitic acid, pyromellitic acid, citric acid, malic acid, aconitic acid or 1,2,3,4-cyclobutanetetracarboxylic acid.

The lower limit of the content of the organic acid (B) in the cleaning composition content with respect to 10 parts by mass of the novolak resin (A) is preferably 0.001 parts by mass, more preferably 0.01 parts by mass, and still more preferably 0.1 parts by mass. The upper limit of the content of the organic acid (B) with respect to 10 parts by mass of the novolak resin (A) is preferably 10 parts by mass, more preferably 5 parts by mass, still more preferably 2 parts by mass, and particularly preferably 1 part by mass. When the content of the organic acid (B) falls within the above range, film removability and particle removability can be more improved.

(C) Solvent

The cleaning composition contains the solvent (C). The solvent (C) is exemplified by an alcohol solvent, a ketone solvent, an ether solvent, an ester solvent, a nitrogen-containing solvent, water, and the like. The solvent (C) may be used either alone of one type, or in combination of two or more types thereof.

Examples of the alcohol solvent include: monohydric alcohol solvents such as methanol, ethanol, n-propanol, iso-propanol, n-butanol, iso-butanol and 4-methyl-2-pentanol; polyhydric alcohol solvents such as ethylene glycol, 1,2-propylene glycol, diethylene glycol, dipropylene glycol, triethylene glycol, tetraethylene glycol, hexaethylene glycol, tripropylene glycol, 1,2-butanediol, 1,3-butanediol, 1,4-butanediol, 1,2-hexanediol, 2-methylpentane-2,4-diol, 2,2-dimethyl-1,3-propanediol and glycerin; and the like. It is to be noted that as referred to herein, the "alcohol solvent" means a solvent constituted with a compound obtained by substituting with a hydroxy group, one or a plurality of hydrogen atoms included in an aliphatic hydrocarbon.

Examples of the ketone solvent include acetone, methyl ethyl ketone, methyl-n-propyl ketone, methyl-iso-butyl ketone, cyclohexanone, and the like.

Examples of the ether solvent include:

alkyl ethers such as ethyl ether and iso-propyl ether;

alkylene glycol monoalkyl ethers such as propylene glycol monomethyl ether, propylene glycol monoethyl ether and propylene glycol monopropyl ether;

dialkylene glycol monoalkyl ethers such as diethylene glycol monomethyl ether, diethylene glycol monoethyl ether, diethylene glycol monobutyl ether and dipropylene glycol monomethyl ether;

alkylene glycol dialkyl ethers such as ethylene glycol diethyl ether and ethylene glycol dibutyl ether;

dialkylene glycol dialkyl ethers such as diethylene glycol dimethyl ether, diethylene glycol diethyl ether, diethylene glycol methyl ethyl ether, diethylene glycol isopropyl methyl ether and dipropylene glycol dipropyl ether;

trialkylene glycol monoalkyl ethers such as triethylene glycol monomethyl ether and tripropylene glycol monomethyl ether;

trialkylene glycol dialkyl ethers such as triethylene glycol dimethyl ether, triethylene glycol diethyl ether and triethylene glycol butyl methyl ether;

tetraalkylene glycol monoalkyl ethers such as tetraethylene glycol monomethyl ether and tetraethylene glycol monoethyl ether;

tetraalkylene glycol dialkyl ethers such as tetraethylene glycol dimethyl ether and tetraethylene glycol diethyl ether;

tetrahydrofuran and 3-methoxy-3-methyl-1-butanol; and the like.

Examples of the ester solvent include ethyl acetate, γ-butyrolactone, n-butyl acetate, ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, dipropylene glycol monomethyl ether acetate, dipropylene glycol monoethyl ether acetate, ethyl propionate, n-butyl propionate, methyl lactate, ethyl lactate, and the like.

Examples of the nitrogen-containing solvent include N,N-dimethylformamide, N,N-dimethylacetamide, N-methylpyrrolidone, and the like.

Of these, the ether solvent and the alcohol solvent are preferred, alkylene glycol monoalkyl ether, dialkylene glycol monoalkyl ether, dialkylene glycol dialkyl ether, trialkylene glycol monoalkyl ether, trialkylene glycol dialkyl ether, tetraalkylene glycol dialkyl ether, monohydric alcohol solvent and polyhydric alcohol solvent are more preferred, propylene glycol monomethyl ether, propylene glycol monoethyl ether and propylene glycol monopropyl ether are still more preferred, and propylene glycol monoethyl ether is particularly preferred.

The lower limit of the proportion of the ether solvent, the alcohol solvent or a combination thereof contained in the solvent (C) is preferably 50% by mass, more preferably 60% by mass, still more preferably 70% by mass, and particularly preferably 100% by mass.

Optional Component

The cleaning composition may contain optional component(s) such as (D) a surfactant as needed, within a range not leading to impairment of the effects of the present invention. The optional component may be used either alone of one type, or in combination of two or more types thereof.

(D) Surfactant

As the optional component, the surfactant (D) is preferred. When the cleaning composition further contains the surfactant (D), the coating characteristics can be more improved. The surfactant (D) is exemplified by a nonionic surfactant, a cationic surfactant, an anionic surfactant, and the like.

Examples of the nonionic surfactant include ether type nonionic surfactants such as polyoxyethylene alkyl ethers; ether-ester type nonionic surfactants such as polyoxyethylene ethers of a glycerin ester; ester type nonionic surfactants such as polyethylene glycol fatty acid esters, glycerin esters and sorbitan esters, and the like. Examples of a commercially available product of the nonionic surfactant include: "Newcol 2320", "Newcol 714-F", "Newcol 723", "Newcol 2307" and "Newcol 2303" (all manufactured by Nipon Nyukazai Co., Ltd.); "Pionin D-1107-S", "Pionin D-1007" and "Pionin D-1106-DIR" and "Newkalgen TG310" (all manufactured by TAKEMOTO OIL & FAT Co., Ltd); a compound represented by the following formula (D-1) and a compound represented by the following formula (D-2); and the like. In the following formula (D-1), aA, bA, cA and dA are each independently an integer of 1 to 100. In the following formula (D-2), nA and mA are each independently an integer of 1 to 100.

The cationic surfactant is exemplified by an aliphatic amine salt, an aliphatic ammonium salt, and the like.

Examples of the anionic surfactant include: carboxylic acid salts such as fatty acid soap and alkyl ether carboxylic acid salts; sulfonic acid salts such as alkylbenzene sulfonic acid salts, alkylnaphthalene sulfonic acid salts and α-olefin sulfonic acid salts; sulfuric acid ester salts such as higher alcohol sulfuric acid ester salts and alkyl ether sulfuric acid salts; phosphoric acid ester salts such as alkyl phosphate esters; and the like.

The surfactant (D) is preferably the nonionic surfactant in light of coating characteristics of the cleaning composition.

In a case in which the cleaning composition contains the surfactant (D), the lower limit of the content of the surfactant (D) in the cleaning composition with respect to 10 parts by mass of the novolak resin (A) is preferably 0.001 parts by mass, and more preferably 0.01 parts by mass. The lower limit of the content of the surfactant (D) is preferably 3 parts by mass, more preferably 2 parts by mass, still more preferably 1 part by mass, and particularly preferably 0.1 parts by mass. When the content of the surfactant (D) falls within the above range, the coating characteristics can be more improved.

Preparation Procedure of Cleaning Composition

The cleaning composition may be prepared by for example: mixing the novolak resin (A), the organic acid (B) and the solvent (C), as well as the surfactant (D) and other optional component which may be contained as needed, at a certain ratio, preferably followed by filtering a resultant mixture through a filter, etc., having a pore size of, for example, 0.1 to 5 μm. The lower limit of the solid content concentration in the cleaning composition is preferably 0.1% by mass, more preferably 0.5% by mass, still more preferably 1% by mass, and particularly preferably 2% by mass. The upper limit of the solid content concentration is preferably 20% by mass, more preferably 15% by mass, still more preferably 13% by mass, and particularly preferably 10% by mass. When the solid content concentration falls within the above range, the coating characteristics can be more improved.

Cleaning Method of Semiconductor Substrate

A cleaning method of a semiconductor substrate in which the composition for cleaning a semiconductor substrate of the embodiment of the invention is used includes the steps of: applying the cleaning composition on the surface of the semiconductor substrate (hereinafter, may be also referred to as "applying step"); and removing a film (hereinafter, may be also referred to as "film (I)") formed by the applying step (hereinafter, may be also referred to as "removing step").

By applying the aforementioned cleaning composition of the embodiment of the invention to form the film (I) on the surface of the semiconductor substrate, unwanted substances on the surface of the substrate can be efficiently removed. Furthermore, the film (I) thus formed can be easily removed from the surface of the substrate. Therefore, the cleaning composition is applicable to substrates made of a variety of materials. Examples of the substrate to which the cleaning composition is applicable include: metal or metalloid substrates such as a silicon substrate, an aluminum substrate, a nickel substrate, a chromium substrate, a molybdenum substrate, a tungsten substrate, a copper substrate, a tantalum substrate and a titanium substrate; ceramic substrates such as a silicon nitride substrate, an alumina substrate, a silicon dioxide substrate, a tantalum nitride substrate and a titanium nitride substrate; and the like. Of these, the silicon substrate, the silicon nitride substrate and the titanium nitride substrate are preferred, and the silicon substrate is more preferred.

Examples of the pattern of the patterned semiconductor substrate include: line-and-space patterns and trench patterns, with line width of space portions being no greater than 2,000 nm, no greater than 1,000 nm, no greater than 500 nm, or no greater than 50 nm; hole patterns, with diameters of holes being no greater than 300 nm, no greater than 150 nm, no greater than 100 nm, or no greater than 50 nm; and the like.

With respect to the dimension in the pattern formed on the substrate, fine patterns may involve: a height of no less than 100 nm, no less than 200 nm, or no less than 300 nm; a width of no greater than 50 nm, no greater than 40 nm, or no greater than 30 nm; and an aspect ratio (pattern height/pattern width) of no less than 3, no less than 5, or no less than 10.

It is preferred that the film (I) formed by applying the cleaning composition enables the recessed portions of the pattern to be filled therewith. Due to the film (I) enabling the recessed portions of the pattern to be filled therewith, particles attached to the recessed portions of the pattern can be efficiently removed, thereby leading to a superior particle removing effect achieved.

One application example of the cleaning method of a substrate in which the cleaning composition of the embodiment according to the present invention is used is described in more detail with reference to the drawings.

Figure 1A:
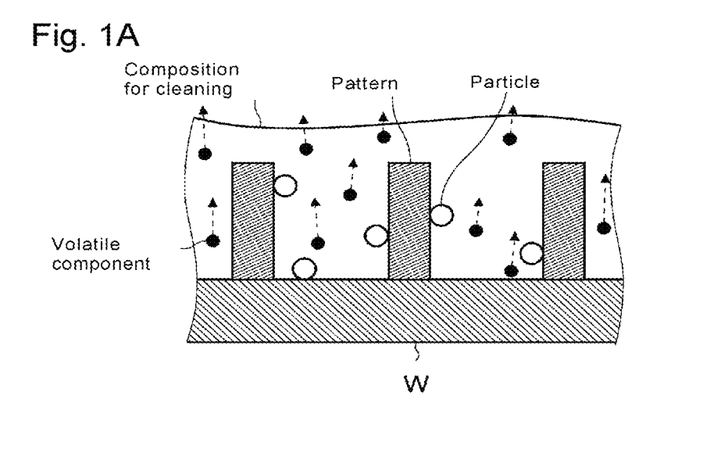
FIG. 1A is an explanatory view illustrating one step of a cleaning method of a semiconductor substrate in which the composition for cleaning a semiconductor substrate of the embodiment of the present invention is used.

As shown in FIG. 1A, in this application example, the aforementioned cleaning composition is used as a treatment liquid for forming a film (I) on a patterned substrate (wafer W). First, the cleaning composition is supplied and applied on the wafer W to form the film (I). The applying procedure may involve, for example, spin coating, cast coating, roll coating, and the like. As needed, the coating film formed is subjected to heat and/or reduced pressure to remove a part or all of volatile components such as the solvent (C) contained in the film (I). Thus, solidification or hardening of the solid content contained in the cleaning composition can be promoted. The term "solidification" as referred to herein means giving a state of solid, and "hardening" as referred to means an increase of the molecular weight through linking between the molecules (for example, crosslinking, polymerization and the like). In this procedure, the particles attached to the pattern, the wafer W and the like are incorporated into the film and drawn away from the pattern, the wafer W and the like (see FIG. 1B).

The lower limit of the temperature of the heating for the solidification and/or hardening is preferably 30° C., and more preferably 40° C. The upper limit of the temperature of the heating is preferably 200° C., more preferably 100° C., and still more preferably 90° C. The lower limit of the time period of the heating is preferably 5 sec, more preferably 10 sec, and still more preferably 30 sec. The upper limit of the time period of the heating is preferably 10 min, more preferably 5 min, and still more preferably 2 min. The average thickness of the film (I) formed is not particularly limited, and the lower limit of the average thickness of the coating film on the upper face of the substrate pattern is preferably 10 nm, more preferably 20 nm, and still more preferably 50 nm. The upper limit of the average thickness is preferably 1,000 nm, and more preferably 500 nm.

Figure 1B:
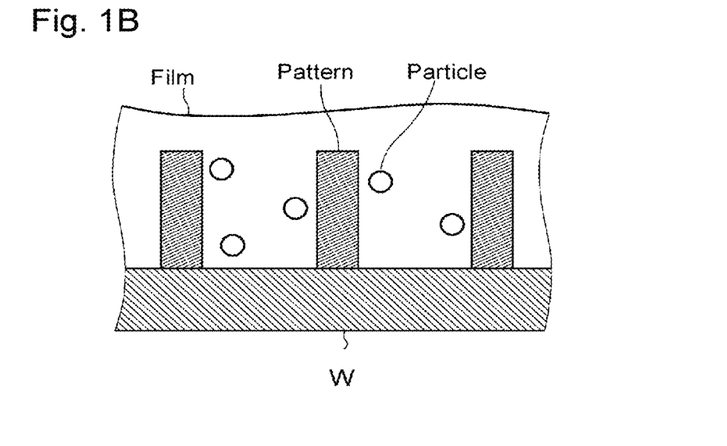
FIG. 1B is an explanatory view illustrating a step following the one step shown in FIG. 1A.

Next, a removing liquid that dissolves the film (I) is supplied onto the film (I), whereby the film is entirely removed from the wafer W. As a result, the particles are removed from the wafer W together with the film (I). As the removing liquid, water, an organic solvent, an aqueous alkaline solution or the like may be used, water and an aqueous alkaline solution are preferred, and an aqueous alkaline solution is more preferred. As the aqueous alkaline solution, an alkaline developer solution may be used, which may be a well-known alkaline developer solution. Specific examples of the alkaline developer solution include aqueous solutions containing at least one of ammonia, tetramethylammonium hydroxide (TMAH) and choline, and the like. As the organic solvent, for example, a thinner, isopropyl alcohol (IPA), 4-methyl-2-pentanol (MIBC), toluene, acetic acid esters, alcohols, glycols (propylene glycol monomethyl ether, etc.) or the like may be used. Also, the removal of the film (I) may be carried out sequentially through using different types of the removing liquids, e.g., by supplying water as the removing liquid first on the film (I), and then supplying an alkaline developer solution. By sequentially using different types of the removing liquids, film removability can be further improved.

Figure 1C:
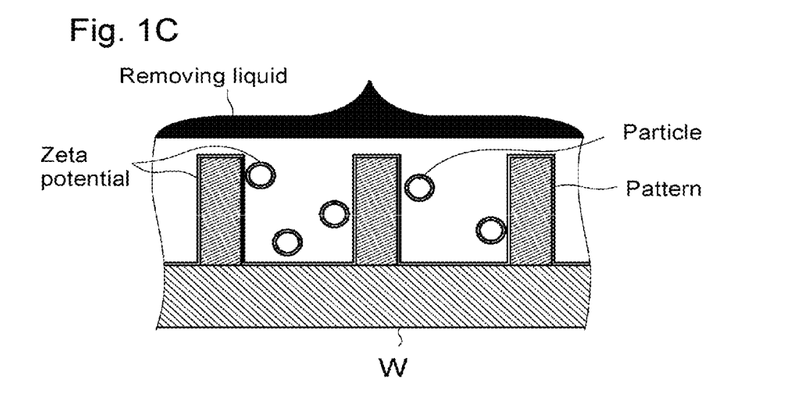
FIG. 1C is an explanatory view illustrating a step following the step shown in FIG. 1B.

When the removing liquid such as an alkaline developer solution or the like is supplied, zeta potentials having identical polarity (in this case, minus) are generated on the wafer W, the pattern surface and the particle surface, as shown in FIG. 1C. The particles drawn away from the wafer W and the like are charged with a zeta potential having identical polarity to that of the wafer W and the like, leading to resilience with the wafer W and the like. Accordingly, reattachment of the particle to the wafer W and the like can be prevented.

Thus, in the present application example, the particles can be removed with a weaker force as compared with conventional removal of the particles by way of physical force, and therefore, pattern collapse can be inhibited. In addition, since the particles are removed without utilizing a chemical action, erosion of the wafer W and pattern due to an etching action, etc., can be also inhibited. Furthermore, smaller particles, and particles embedded into gaps of the pattern can be also easily removed, which involve difficulty in the removal according to a cleaning method for substrates carried out using a physical force.

The cleaning composition supplied onto the wafer W is finally removed completely from the wafer W. Therefore, the wafer W after the cleaning will have a state as before coating the cleaning composition, more specifically, a state in which the circuit-forming face is exposed.

The cleaning method may be carried out using a well-known various apparatus and memory medium. A suitable apparatus is exemplified by an apparatus for cleaning a substrate disclosed in Japanese Unexamined Patent Application, Publication No. 2014-99583. A specific exemplary apparatus is a cleaning apparatus for a semiconductor substrate, including: a first liquid-feeding zone for supplying the cleaning composition to a semiconductor substrate; and a second liquid-feeding zone for supplying on the film (I), a removing liquid for dissolving the film (I) formed from the cleaning composition supplied to the substrate by the aforementioned first liquid-feeding zone. An exemplary memory medium is a computer-readable memory medium that stores a program for controlling the apparatus for cleaning a substrate and is capable of operating on a computer, and the program allows the computer to control the apparatus for cleaning a substrate such that the cleaning method of a semiconductor substrate is carried out upon execution.

EXAMPLES

Hereinafter, the embodiments of the present invention will be explained in more detail by way of Examples, and the present invention is not in any way limited to these Examples.

Weight Average Molecular Weight (Mw)

Mw of a resin was determined by gel permeation chromatography (detector: differential refractometer) using GPC columns ("G2000HXL"×2, "G3000HXL"×1, "G4000HXL"×1, available from Tosoh Corporation) under analytical conditions involving a flow rate of 1.0 mL/min, an elution solvent of tetrahydrofuran and a column temperature of 40° C., with mono-dispersed polystyrene as a standard.

Average Thickness of Film

The average thickness of the film was measured by using a spectroscopic ellipsometer ("M-2000D", available from J.A. Woollam Co.).

Synthesis of Novolak Resin (A)

Novolak resins (A-1) to (A-8) represented by the following formulae (A-1) to (A-8) were synthesized according to the procedure shown below.

Synthesis Example 1: Synthesis of Novolak Resin (A-1)

Into a reaction vessel, 70 g of m-cresol, 57.27 g of p-cresol, 95.52 g of 37% formaldehyde and 381.82 g of methyl isobutyl ketone were charged and dissolved in a nitrogen atmosphere. After a thus obtained solution was heated to 40° C., 2.03 g of paratoluenesulfonic acid was added thereto and a reaction was allowed at 85° C. for 4 hrs. The reaction mixture was cooled to 30° C. or below, and this reaction mixture was charged into a mixed solution of methanol/water (50/50 (mass ratio)) to permit reprecipitation. The precipitate was collected on a filter paper and then dried to give the novolak resin (A-1). Mw of the novolak resin (A-1) was 50,000.

Synthesis Example 2: Synthesis of Novolak Resin (A-2)

Into a reaction vessel, 150 g of 2,7-dihydroxynaphthalene, 76.01 g of 37% formaldehyde and 450 g of methyl isobutyl ketone were charged and dissolved in a nitrogen atmosphere. After a thus obtained solution was heated to 40° C., 1.61 g of paratoluenesulfonic acid was added thereto and a reaction was allowed at 80° C. for 7 hrs. The reaction mixture was cooled to 30° C. or below, and this reaction mixture was charged into a mixed solution of methanol/water (50/50 (mass ratio)) to permit reprecipitation. The precipitate was collected on a filter paper and then dried to give the novolak resin (A-2). Mw of the novolak resin (A-2) was 3,000.

Synthesis Example 3: Synthesis of Novolak Resin (A-3)

Into a reaction vessel, 120 g of phenol, 103.49 g of 37% formaldehyde and 360.00 g of methyl isobutyl ketone were charged and dissolved in a nitrogen atmosphere. After a thus obtained solution was heated to 40° C., 2.20 g of paratoluenesulfonic acid was added thereto and a reaction was allowed at 79° C. for 4 hrs. The reaction mixture was cooled to 30° C. or below, and this reaction mixture was charged into a mixed solution of methanol/water (50/50 (mass ratio)) to permit reprecipitation. The precipitate was collected on a filter paper and then dried to give the novolak resin (A-3). Mw of the novolak resin (A-3) was 10,000.

Synthesis Example 4: Synthesis of Novolak Resin (A-4)

Into a reaction vessel, 120 g of resorcinol, 88.46 g of 37% formaldehyde and 360.00 g of propylene glycol monoethyl ether were charged and dissolved in a nitrogen atmosphere. After a thus obtained solution was heated to 40° C., 1.88 g of paratoluenesulfonic acid was added thereto and a reaction was allowed at 79° C. for 4 hrs. The reaction mixture was cooled to 30° C. or below, and this reaction mixture was charged into a mixed solution of methanol/water (50/50 (mass ratio)) to permit reprecipitation. The precipitate was collected on a filter paper and then dried to give the novolak resin (A-4). Mw of the novolak resin (A-4) was 10,000.

Synthesis Example 5: Synthesis of Novolak Resin (A-5)

Into a reaction vessel, 120 g of pyrogallol, 77.23 g of 37% formaldehyde and 360.00 g of propylene glycol monoethyl ether were charged and dissolved in a nitrogen atmosphere. After a thus obtained solution was heated to 40° C., 1.64 g of paratoluenesulfonic acid was added thereto and a reaction was allowed at 79° C. for 4 hrs. The reaction mixture was cooled to 30° C. or below, and this reaction mixture was charged into a mixed solution of methanol/water (50/50 (mass ratio)) to permit reprecipitation. The precipitate was collected on a filter paper and then dried to give the novolak resin (A-5). Mw of the novolak resin (A-5) was 10,000.

Synthesis Example 6: Synthesis of Novolak Resin (A-6)

Into a reaction vessel, 120 g of m-cresol, 90.06 g of 37% formaldehyde and 360.00 g of methyl isobutyl ketone were charged and dissolved in a nitrogen atmosphere. After a thus obtained solution was heated to 40° C., 1.91 g of paratoluenesulfonic acid was added thereto and a reaction was allowed at 79° C. for 4 hrs. The reaction mixture was cooled to 30° C. or below, and this reaction mixture was charged into a mixed solution of methanol/water (50/50 (mass ratio)) to permit reprecipitation. The precipitate was collected on a filter paper and then dried to give the novolak resin (A-6). Mw of the novolak resin (A-6) was 8,000.

Synthesis Example 7: Synthesis of Novolak Resin (A-7)

Into a reaction vessel, 130 g of m-cresol, 37.71 g of phenol, 97.57 g of 37% formaldehyde and 335.42 g of methyl isobutyl ketone were charged and dissolved in a nitrogen atmosphere. After a thus obtained solution was heated to 40° C., 2.07 g of paratoluenesulfonic acid was added thereto and a reaction was allowed under reflux for 4 hrs. The reaction mixture was cooled to 30° C. or below, and this reaction mixture was charged into a mixed solution of methanol/water (50/50 (mass ratio)) to permit reprecipitation. The precipitate was collected on a filter paper and then dried to give the novolak resin (A-7). Mw of the novolak resin (A-7) was 10,000.

Synthesis Example 8: Synthesis of Novolak Resin (A-8)

Into a reaction vessel, 80 g of m-cresol, 66.65 g of resorcinol, 60.04 g of 37% formaldehyde and 439.94 g of methyl isobutyl ketone were charged and dissolved in a nitrogen atmosphere. After a thus obtained solution was heated to 40° C., 1.28 g of paratoluenesulfonic acid was added thereto and a reaction was allowed at 79° C. for 4 hrs. The reaction mixture was cooled to 30° C. or below, and this reaction mixture was charged into a mixed solution of methanol/water (50/50 (mass ratio)) to permit reprecipitation. The precipitate was collected on a filter paper and then dried to give the novolak resin (A-8). Mw of the novolak resin (A-8) was 5,000.

Synthesis Example 9: Synthesis of Polymer (a-1)

A monomer solution was prepared by dissolving 64.49 g of a compound (M-1) represented by the following formula (M-1), 34.51 g of a compound (M-2) represented by the following formula (M-2) and 4.20 g of azobisisobutyronitrile (AIBN) in 100 g of 2-butanone. A 1,000-mL three-neck flask which had been charged with 100 g of 2-butanone was purged with nitrogen for 30 min. The nitrogen purge was followed by heating to 80° C., and the monomer solution was added dropwise with stirring over 3 hrs. The time of the start of the dropwise addition was regarded as the time of the start of the polymerization reaction, and the polymerization was allowed for 6 hrs. After completing the polymerization, the reaction solution was cooled to no greater than 30° C. The reaction solution was concentrated under reduced pressure to give a mass of 150 g, and thereto were charged 150 g of methanol and 750 g of n-hexane to permit separation. After the separation, the underlayer liquid was recovered. To the recovered underlayer liquid was charged 750 g of n-hexane, and again subjected to purification through separation. After the separation, the underlayer liquid was recovered. The solvent was removed from the underlayer liquid thus recovered, and 4-methyl-2-pentanol was added thereto to give a solution containing a polymer (a-1) represented by the following formula (a-1). Mw of the polymer (a-1) was 10,000.

(M-1)

Preparation of Cleaning Composition

Each component used in preparing the cleaning compositions is as presented below.

(A) Novolak Resin (A)

In Examples 1 to 60, the novolak resins (A-1) to (A-8) synthesized as described above were used.

In Comparative Examples 1 to 3, the following polymers were used in place of the novolak resin (A).

a-1: the polymer (a-1) synthesized as described above
a-2: a parahydroxystyrene resin (a-2) (Mw: 10,000, manufactured by Aldrich Co.)

(B) Organic acid
B-1: acetic acid
B-2: propionic acid
B-3: sorbic acid
B-4: benzoic acid
B-5: oxalic acid
B-6: malic acid
B-7: aconitic acid
B-8: citric acid
B-9: 1,2,3,4-cyclobutanetetracarboxylic acid (C) Solvent
C-1: propylene glycol monomethyl ether
C-2: propylene glycol monoethyl ether
C-3: propylene glycol monopropyl ether
C-4: isopropyl alcohol
C-5: 4-methyl-2-pentanol
C-6: ethyl lactate
C-7: propylene glycol monomethyl ether acetate
C-8: triethylene glycol
C-9: γ-butyrolactone
C-10: triethylene glycol butyl methyl ether
C-11: diethylene glycol methyl ethyl ether
C-12: 3-methoxy-3-methyl-1-butanol
C-13: propylene glycol
C-14: dipropylene glycol monomethyl ether
C-15: ethylene glycol
C-16: diethylene glycol monoethyl ether acetate
C-17: tripropylene glycol monomethyl ether
C-18: tetraethylene glycol dimethyl ether
C-19: dipropylene glycol
C-20: tripropylene glycol
C-21: diethylene glycol dimethyl ether
C-22: diethylene glycol isopropyl methyl ether
C-23: diethylene glycol diethyl ether
C-24: diethylene glycol monomethyl ether
C-25: diethylene glycol monoethyl ether
C-26: triethylene glycol dimethyl ether
C-27: diethylene glycol monobutyl ether
C-28: triethylene glycol monomethyl ether
C-29: 2,2-dimethyl-1,3-propanediol
C-30: 2-methylpentane-2,4-diol
C-31: 1,2-butanediol
C-32: 1,3-butanediol
C-33: 1,4-butanediol
C-34: tetraethylene glycol
C-35: hexaethylene glycol
C-36: glycerin
C-37: 1,2-hexanediol (D) Surfactant D-1: a compound represented by the following formula (D-1)

In the above formula (D-1), aA, bA, cA and dA are each independently an integer of 1 to 100.

Example 1

In 100 parts by mass of (C-1) as the solvent (C), 10 parts by mass of (A-1) as the novolak resin (A), and 0.04 parts by mass of (B-1) as the organic acid (B) were dissolved. A resultant solution was filtered through a membrane filter having a pore size of 0.1 μm to prepare a cleaning composition (J-1).

Examples 2 to 60 and Comparative Examples 1 to 3

Cleaning compositions (J-2) to (J-60) and (j-1) to (j-3) were prepared in a similar manner to Example 1 except that each component of the type and the amount shown in Tables 1 and 2 below was used. In Table 1, a denotation "-" indicates that a corresponding component was not used.

TABLE 1

| | Cleaning composition for semiconductor substrate | (A) Novolak resin type | parts by mass | (B) Organic acid type | parts by mass | (C) Solvent Type | parts by mass | type | parts by mass | (D) Surfactant type | parts by mass |
|---|---|---|---|---|---|---|---|---|---|---|---|
| Example 1 | J-1 | A-1 | 10 | B-1 | 0.04 | C-1 | 100 | — | — | — | — |
| Example 2 | J-2 | A-1 | 10 | B-2 | 0.04 | C-1 | 100 | — | — | — | — |
| Example 3 | J-3 | A-1 | 10 | B-3 | 0.04 | C-1 | 100 | — | — | — | — |
| Example 4 | J-4 | A-1 | 10 | B-4 | 0.04 | C-1 | 100 | — | — | — | — |
| Example 5 | J-5 | A-1 | 10 | B-5 | 0.04 | C-1 | 100 | — | — | — | — |
| Example 6 | J-6 | A-1 | 10 | B-6 | 0.04 | C-1 | 100 | — | — | — | — |
| Example 7 | J-7 | A-1 | 10 | B-7 | 0.04 | C-1 | 100 | — | — | — | — |
| Example 8 | J-8 | A-1 | 10 | B-8 | 0.04 | C-1 | 100 | — | — | — | — |
| Example 9 | J-9 | A-1 | 10 | B-9 | 0.04 | C-1 | 100 | — | — | — | — |
| Example 10 | J-10 | A-1 | 10 | B-5 | 0.50 | C-1 | 100 | — | — | — | — |
| Example 11 | J-11 | A-1 | 11.8 | B-5 | 5.00 | C-1 | 100 | — | — | — | — |
| Example 12 | J-12 | A-1 | 10 | B-6 | 0.50 | C-1 | 100 | — | — | — | — |
| Example 13 | J-13 | A-1 | 10 | B-6 | 3.00 | C-1 | 100 | — | — | — | — |
| Example 14 | J-14 | A-1 | 10 | B-6 | 0.04 | C-1 | 300 | — | — | — | — |
| Example 15 | J-15 | A-1 | 10 | B-6 | 0.04 | C-2 | 100 | — | — | — | — |
| Example 16 | J-16 | A-1 | 10 | B-6 | 0.04 | C-3 | 100 | — | — | — | — |
| Example 17 | J-17 | A-1 | 10 | B-6 | 0.04 | C-2 | 40 | C-4 | 60 | — | — |
| Example 18 | J-18 | A-1 | 10 | B-6 | 0.04 | C-2 | 70 | C-4 | 30 | — | — |
| Example 19 | J-19 | A-1 | 10 | B-6 | 0.04 | C-2 | 70 | C-5 | 30 | — | — |
| Example 20 | J-20 | A-1 | 10 | B-6 | 0.04 | C-2 | 70 | C-6 | 30 | — | — |
| Example 21 | J-21 | A-1 | 10 | B-6 | 0.04 | C-2 | 70 | C-7 | 30 | — | — |
| Example 22 | J-22 | A-1 | 11.8 | B-5 | 5.00 | C-4 | 35 | C-6 | 65 | — | — |
| Example 23 | J-23 | A-2 | 10 | B-6 | 0.04 | C-2 | 100 | — | — | — | — |
| Example 24 | J-24 | A-3 | 10 | B-6 | 0.04 | C-2 | 100 | — | — | — | — |
| Example 25 | J-25 | A-4 | 10 | B-6 | 0.04 | C-2 | 100 | — | — | — | — |
| Example 26 | J-26 | A-5 | 10 | B-6 | 0.04 | C-2 | 100 | — | — | — | — |
| Example 27 | J-27 | A-6 | 10 | B-6 | 0.04 | C-2 | 100 | — | — | — | — |
| Example 28 | J-28 | A-7 | 10 | B-6 | 0.04 | C-2 | 100 | — | — | — | — |
| Example 29 | J-29 | A-8 | 10 | B-6 | 0.04 | C-2 | 100 | — | — | — | — |
| Example 30 | J-30 | A-1 | 10 | B-6 | 0.04 | C-2 | 100 | — | — | D-1 | 0.01 |
| Comparative Example 1 | j-1 | a-1 | 10 | B-1 | 0.04 | C-2 | 100 | — | — | — | — |
| Comparative Example 2 | j-2 | a-2 | 10 | B-1 | 0.04 | C-4 | 35 | C-6 | 65 | — | — |
| Comparative Example 3 | j-3 | a-2 | 11.8 | B-5 | 5.00 | C-4 | 35 | C-6 | 65 | — | — |

TABLE 2

| | Cleaning composition for semiconductor substrate | (A) Novolak resin type | parts by mass | (B) Organic acid type | parts by mass | (C) Solvent type | parts by mass | type | parts by mass |
|---|---|---|---|---|---|---|---|---|---|
| Example 31 | J-31 | A-1 | 10 | B-6 | 0.04 | C-1 | 90 | C-8 | 10 |
| Example 32 | J-32 | A-1 | 10 | B-6 | 0.04 | C-1 | 90 | C-9 | 10 |
| Example 33 | J-33 | A-1 | 10 | B-6 | 0.04 | C-1 | 90 | C-10 | 10 |
| Example 34 | J-34 | A-1 | 10 | B-6 | 0.04 | C-1 | 90 | C-11 | 10 |
| Example 35 | J-35 | A-1 | 10 | B-6 | 0.04 | C-1 | 90 | C-12 | 10 |
| Example 36 | J-36 | A-1 | 10 | B-6 | 0.04 | C-1 | 90 | C-13 | 10 |
| Example 37 | J-37 | A-1 | 10 | B-6 | 0.04 | C-1 | 90 | C-14 | 10 |
| Example 38 | J-38 | A-1 | 10 | B-6 | 0.04 | C-1 | 90 | C-15 | 10 |
| Example 39 | J-39 | A-1 | 10 | B-6 | 0.04 | C-1 | 90 | C-16 | 10 |
| Example 40 | J-40 | A-1 | 10 | B-6 | 0.04 | C-1 | 90 | C-17 | 10 |
| Example 41 | J-41 | A-1 | 10 | B-6 | 0.04 | C-1 | 90 | C-18 | 10 |
| Example 42 | J-42 | A-1 | 10 | B-6 | 0.04 | C-1 | 90 | C-19 | 10 |
| Example 43 | J-43 | A-1 | 10 | B-6 | 0.04 | C-1 | 90 | C-20 | 10 |
| Example 44 | J-44 | A-1 | 10 | B-6 | 0.04 | C-1 | 90 | C-21 | 10 |
| Example 45 | J-45 | A-1 | 10 | B-6 | 0.04 | C-1 | 90 | C-22 | 10 |
| Example 46 | J-46 | A-1 | 10 | B-6 | 0.04 | C-1 | 90 | C-23 | 10 |
| Example 47 | J-47 | A-1 | 10 | B-6 | 0.04 | C-1 | 90 | C-24 | 10 |
| Example 48 | J-48 | A-1 | 10 | B-6 | 0.04 | C-1 | 90 | C-25 | 10 |
| Example 49 | J-49 | A-1 | 10 | B-6 | 0.04 | C-1 | 90 | C-26 | 10 |
| Example 50 | J-50 | A-1 | 10 | B-6 | 0.04 | C-1 | 90 | C-27 | 10 |
| Example 51 | J-51 | A-1 | 10 | B-6 | 0.04 | C-1 | 90 | C-28 | 10 |
| Example 52 | J-52 | A-1 | 10 | B-6 | 0.04 | C-1 | 90 | C-29 | 10 |
| Example 53 | J-53 | A-1 | 10 | B-6 | 0.04 | C-1 | 90 | C-30 | 10 |

TABLE 2-continued

| | Cleaning composition for semi-conductor substrate | (A) Novolak resin type | parts by mass | (B) Organic acid type | parts by mass | (C) Solvent type | parts by mass | type | parts by mass |
|---|---|---|---|---|---|---|---|---|---|
| Example 54 | J-54 | A-1 | 10 | B-6 | 0.04 | C-1 | 90 | C-31 | 10 |
| Example 55 | J-55 | A-1 | 10 | B-6 | 0.04 | C-1 | 90 | C-32 | 10 |
| Example 56 | J-56 | A-1 | 10 | B-6 | 0.04 | C-1 | 90 | C-33 | 10 |
| Example 57 | J-57 | A-1 | 10 | B-6 | 0.04 | C-1 | 90 | C-34 | 10 |
| Example 58 | J-58 | A-1 | 10 | B-6 | 0.04 | C-1 | 90 | C-35 | 10 |
| Example 59 | J-59 | A-1 | 10 | B-6 | 0.04 | C-1 | 90 | C-36 | 10 |
| Example 60 | J-60 | A-1 | 10 | B-6 | 0.04 | C-1 | 90 | C-37 | 10 |

Evaluations

Coating characteristics, film removability and particle removability were evaluated on the cleaning compositions of Examples 1 to 60 and Comparative Examples 1 to 3 in accordance with the following methods. The results of the evaluations are shown in Tables 3 and 4.

Coating Characteristics

The cleaning compositions prepared as described above were each applied on a silicon wafer (substrate) by a coating method using a spin coater ("CLEAN TRACK ACT12" available from Tokyo Electron Limited), and heated on a hot plate at 40° C. for 60 sec, followed by cooling at 23° C. for 60 sec to give substrates on which a film (film (I)) of each cleaning composition of Examples 1 to 60 and Comparative Examples 1 to 3 was formed having an average thickness of 100 nm. Each silicon wafer on which the cleaning composition film was formed was visually observed on the presence/absence of streaky defects (striations) running from the center toward circumferential directions. The coating characteristics were evaluated to be: "A" (extremely favorable) in a case of the streaky defects (striations) not being found; "B" (favorable) in a case of the streaky defects being partially found; and "C" (unfavorable) in a case of the streaky defects being found on the face entirely.

Evaluations of Film Removability and Particle Removability

Silica particles having a particle diameter of 40 nm were attached onto an 8-inch silicon wafer having a line-and-space pattern (1L 1S, aspect ratio: 1) formed thereon with the line widths of space portions being 500 nm. Each cleaning composition was applied on the silicon wafer by a spin-coating method and heated on a hot plate at 40° C. for 60 sec, followed by cooling at 23° C. for 60 sec to give substrates on which a film (film (I)) of each cleaning composition of Examples 1 to 60 and Comparative Examples 1 to 3 was formed having an average thickness of 100 nm. Thereafter, by using a puddle development apparatus, a film of a 2.38% by mass aqueous tetramethylammonium hydroxide solution as a removing liquid was formed on the cleaning composition film, whereby immersion into the removing liquid was started. Thirty minutes later from the start of the immersion, cleaning with water and drying by a spin-drying method were carried out. Next, the entire surface of the substrate was analyzed by using a defect inspection system in the dark field ("KLA2800", available from KLA-TENCOR Corporation) to evaluate the film removability and the particle removability. The film removability was decided on the basis of the number of residual defects other than silica particles, to be: "A" (extremely favorable) in a case of the number being less than 10 defects/cm²; "B" (favorable) in a case of the number being no less than 10 defects/cm² and less than 50 defects/cm²; and "C" (unfavorable) in a case of the number being no less than 50 defects/cm². The particle removability was decided on the basis of the rate of removal of the silica particles, to be: "A" (extremely favorable) in a case of the rate being no less than 90%; "B" (favorable) in a case of the rate being no less than 50% and less than 90%; and "C" (unfavorable) in a case of the rate being less than 50%.

TABLE 3

| | Coating characteristics | Film removability | Particle removability |
|---|---|---|---|
| Example 1 | A | A | B |
| Example 2 | A | A | A |
| Example 3 | A | A | A |
| Example 4 | A | A | A |
| Example 5 | A | A | B |
| Example 6 | A | A | A |
| Example 7 | A | A | A |
| Example 8 | A | A | A |
| Example 9 | A | A | A |
| Example 10 | A | A | B |
| Example 11 | A | B | B |
| Example 12 | A | A | A |
| Example 13 | A | A | A |
| Example 14 | A | A | A |
| Example 15 | A | A | A |
| Example 16 | A | A | A |
| Example 17 | A | A | A |
| Example 18 | A | A | A |
| Example 19 | A | A | A |
| Example 20 | A | A | A |
| Example 21 | A | A | A |
| Example 22 | A | B | B |
| Example 23 | A | A | A |
| Example 24 | A | A | A |
| Example 25 | A | A | A |
| Example 26 | A | A | A |
| Example 27 | A | A | A |
| Example 28 | A | A | A |
| Example 29 | A | A | A |
| Example 30 | A | A | A |
| Comparative Example 1 | A | A | C |
| Comparative Example 2 | B | A | C |
| Comparative Example 3 | B | B | C |

TABLE 4

| | Coating characteristics | Film removability | Particle removability |
|---|---|---|---|
| Example 31 | A | A | A |
| Example 32 | A | A | A |

TABLE 4-continued

| | Coating characteristics | Film removability | Particle removability |
|---|---|---|---|
| Example 33 | A | A | A |
| Example 34 | A | A | A |
| Example 35 | A | A | A |
| Example 36 | A | A | A |
| Example 37 | A | A | A |
| Example 38 | A | A | A |
| Example 39 | A | A | A |
| Example 40 | A | A | A |
| Example 41 | A | A | A |
| Example 42 | A | A | A |
| Example 43 | A | A | A |
| Example 44 | A | A | A |
| Example 45 | A | A | A |
| Example 46 | A | A | A |
| Example 47 | A | A | A |
| Example 48 | A | A | A |
| Example 49 | A | A | A |
| Example 50 | A | A | A |
| Example 51 | A | A | A |
| Example 52 | A | A | A |
| Example 53 | A | A | A |
| Example 54 | A | A | A |
| Example 55 | A | A | A |
| Example 56 | A | A | A |
| Example 57 | A | A | A |
| Example 58 | A | A | A |
| Example 59 | A | A | A |
| Example 60 | A | A | A |

As shown in Tables 3 and 4, the cleaning compositions of Examples were favorable or extremely favorable in all terms of the coating characteristics, the film removability and the particle removability. On the other hand, the cleaning compositions of Comparative Examples were unfavorable in at least one of the coating characteristics, the film removability and the particle removability.

According to the embodiment of present invention, a composition for cleaning a semiconductor substrate, for use in a process of removing unwanted substances on the surface of a semiconductor substrate through forming a film on the substrate surface can be provided, wherein the composition is capable of efficiently removing fine particles on the substrate surface and enables the formed film to be easily removed from the substrate surface. The composition for cleaning a semiconductor substrate of the embodiment of the present invention can be suitably used in manufacturing processes of semiconductor elements for which further progress of miniaturization, and an increase of the aspect ratio are expected in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A composition for cleaning a semiconductor substrate, comprising:
    a novolak resin;
    an organic acid not being a polymeric compound; and
    a solvent, wherein a solid content concentration of the composition is no greater than 20% by mass, and
    the organic acid comprises at least one selected from the group consisting of
    acetic acid, propionic acid, butanoic acid, pentanoic acid, hexanoic acid, cyclohexanecarboxylic acid, cyclohexyl acetic acid, 1-adamantanecarboxylic acid, benzoic acid, phenylacetic acid,
    difluoroacetic acid, trifluoroacetic acid, pentafluoropropanoic acid, heptafluorobutanoic acid, fluorophenyl acetic acid, difluorobenzoic acid,
    10-hydroxydecanoic acid, 5-oxohexanoic acid, 3-methoxycyclohexanecarboxylic acid, camphorcarboxylic acid, dinitrobenzoic acid, nitrophenylacetic acid, lactic acid, glycolic acid, glyceric acid, salicylic acid, anisic acid, gallic acid, furan carboxylic acid,
    (meth)acrylic acid, crotonic acid, cinnamic acid, sorbic acid,
    oxalic acid, malonic acid, succinic acid, glutaric acid, adipic acid, dodecanedicarboxylic acid, propanetricarboxylic acid, butanetetracarboxylic acid, cyclohexanehexacarboxylic acid, 1,4-naphthalenedicarboxylic acid, isophthalic acid, terephthalic acid,
    difluoromalonic acid, tetrafluorophthalic acid, hexafluoroglutaric acid,
    tartaric acid, citric acid, malic acid, tartronic acid, diglycolic acid, iminodiacetic acid,
    maleic acid, fumaric acid, and aconitic acid.

2. The composition according to claim 1, wherein the organic acid comprises at least one selected from the group consisting of
    oxalic acid, malonic acid, succinic acid, glutaric acid, adipic acid, dodecanedicarboxylic acid, propanetricarboxylic acid, butanetetracarboxylic acid, cyclohexanehexacarboxylic acid, 1,4-naphthalenedicarboxylic acid, isophthalic acid, terephthalic acid,
    difluoromalonic acid, tetrafluorophthalic acid, hexafluoroglutaric acid,
    tartaric acid, citric acid, malic acid, tartronic acid, diglycolic acid, iminodiacetic acid,
    maleic acid, fumaric acid, and aconitic acid.

3. The composition according to claim 2, wherein the organic acid comprises at least one selected from the group consisting of malonic acid, succinic acid, glutaric acid, adipic acid, dodecanedicarboxylic acid, propanetricarboxylic acid, butanetetracarboxylic acid, hexafluoroglutaric acid, cyclohexanehexacarboxylic acid, 1,4-naphthalenedicarboxylic acid, isophthalic acid, terephthalic acid, citric acid, malic acid, and aconitic acid.

4. The composition according to claim 1, wherein a content of the organic acid with respect to 10 parts by mass of the novolak resin is no less than 0.01 parts by mass and no greater than 5 parts by mass.

5. The composition according to claim 1, wherein a content of the organic acid with respect to 10 parts by mass of the novolak resin is no less than 0.001 parts by mass and no greater than 10 parts by mass.

6. The composition according to claim 1, wherein the solvent comprises an ether solvent, an alcohol solvent, or a combination thereof.

7. The composition according to claim 6, wherein a proportion of the ether solvent, the alcohol solvent, or the combination thereof in the solvent is no less than 50% by mass.

8. The composition according to claim 6, wherein the solvent comprises alkylene glycol monoalkyl ether.

9. The composition according to claim 1, wherein a proportion of the novolak resin in a solid content is no less than 70% by mass.

10. The composition according to claim 1, wherein the novolak resin is one of
    novolak resin (A-1) having a molecular weight of 50,000,
    novolak resin (A-2) having a molecular weight of 3,000,
    novolak resin (A-3) having a molecular weight of 10,000,
    novolak resin (A-4) having a molecular weight of 10,000, novolak resin (A-5) having a molecular weight of 10,000,
novolak resin (A-6) having a molecular weight of 8,000,
novolak resin (A-7) having a molecular weight of 10,000, and
novolak resin (A-8) having a molecular weight of 5,000

11. The composition according to claim 10, wherein the novolak resin is one of the novolak resin (A-1), the novolak resin (A-6), and the novolak resin (A-7).

12. The composition according to claim 10, wherein the novolak resin is the novolak resin (A-1).

13. The composition according to claim 10, wherein the novolak resin is the novolak resin (A-6).

14. The composition according to claim 10, wherein the novolak resin is the novolak resin (A-7).

15. The composition according to claim 10, wherein the organic acid comprises at least one selected from the group consisting of tartaric acid, citric acid, malic acid, tartronic acid, diglycolic acid, and iminodiacetic acid.

16. The composition according to claim 11, wherein the organic acid comprises at least one selected from the group consisting of acetic acid, propionic acid, sorbic acid, oxalic acid, malic acid, aconitic acid, and citric acid.

17. The composition according to claim 10, wherein the organic acid comprises malic acid.

18. The composition according to claim 11, wherein the organic acid comprises malic acid.

19. The composition according to claim 17, wherein a proportion of the novolak resin in a solid content is 70%-99.99% by mass.

20. The composition according to claim 18, wherein a proportion of the novolak resin in a solid content is 95%-99.0% by mass.

* * * * *